(12) United States Patent
Yu et al.

(10) Patent No.: US 6,330,193 B1
(45) Date of Patent: *Dec. 11, 2001

(54) METHOD AND APPARATUS FOR LOW CAPACITANCE, HIGH OUTPUT IMPEDANCE DRIVER

(75) Inventors: Leung Yu, Santa Clara; Roxanne T. Vu, San Jose; Benedict C. Lau, San Jose; Huy M. Nguyen, San Jose, all of CA (US); James A. Gasbarro, Pittsburgh, PA (US)

(73) Assignee: Rambus, Inc., Los Altos, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/539,807

(22) Filed: Mar. 31, 2000

(51) Int. Cl.[7] ............................................... G11C 7/00
(52) U.S. Cl. .......................... 365/189.05; 365/189.07; 365/189.11

(58) Field of Search ..................... 365/189.05, 189.06, 365/189.07, 189.11

(56) References Cited

U.S. PATENT DOCUMENTS

| | | | |
|---|---|---|---|
| 5,687,122 | * 11/1997 | Merritt | 365/189.05 |
| 5,796,661 | * 8/1998 | Kim | 365/189.05 |
| 6,052,317 | * 4/2000 | Miura | 365/189.11 |
| 6,072,728 | * 6/2000 | Merritt | 365/189.05 |
| 6,141,257 | * 10/2000 | Rochard | 365/189.05 |

* cited by examiner

*Primary Examiner*—Son T. Dinh
(74) *Attorney, Agent, or Firm*—Lee & Hayes, PLLC

(57) ABSTRACT

A method is described that compares two voltages, one of the voltages indicative of a data line voltage, a second of the voltages indicative of a reference voltage. An input signal is sent to each of a plurality of drivers where at least one of the drivers is coupled to the data line. The input signal is based upon the comparison. A bias is applied to a transistor from the input signal, the bias keeping the transistor in a high output impedance state when the two voltages are the same.

13 Claims, 7 Drawing Sheets

METHOD AND APPARATUS FOR LOW CAPACITANCE, HIGH OUTPUT IMPEDANCE DRIVER

FIELD OF THE INVENTION

The field of invention relates to signal integrity within electronic systems generally; and more specifically, to the biasing of driver transistors within a high output impedance region to maintain acceptable signal integrity.

BACKGROUND

Electronic devices or systems that employ memory typically organize memory components into a memory subsystem. Within most memory subsystems, a device (such as a microprocessor, microcontroller, digital signal processor, memory controller or other device) configured to read data from a memory is coupled to a plurality of memory devices by a data bus.

FIG. 1a shows an exemplary portion of a memory subsystem having a Rambus ASIC Cell (RAC) 105 configured to read data from a plurality of memory devices. For simplicity, FIG. 1a only shows two memory devices D4, D24 coupled to the RAC 105 by a single data line 104. However it is to be understood that in typical memory subsystem architectures, data line 104 is normally associated with a larger data bus that couples more than the two memory devices D4, D24 shown in FIG. 1a.

Within each memory device D4, D24 an output driver circuit is shown that is responsible for driving data from its associated memory device to the RAC 105. Referring to the output driver circuit within memory device D4, note that the designed for signal levels driven by this circuit are 1.8 v at one logic level (e.g., "0") and 1.0 v at another logic level (e.g., "1").

When the logic level to be read from memory device D4 is a logic low, all drivers Q1 through Qn are "off" (i.e., both transistors within each driver are in cutoff). Because no current flows through load resistor 103, the voltage appearing on data line 104 is 1.8 v. When the logic level to be read from memory device D4 is a logic high, one or more drivers Q1 through Qn are "on" (i.e., both transistors within an "on" driver are active) which pulls current through load resistor 103 and lowers the voltage on data line 104.

A feedback loop having a comparator 101 and counter 102 automatically configures the number of "on" drivers to correspond to an output voltage level of 1.0 v for logic high outputs. For each driver that is on more total current is pulled through load resistor 103. If the total current corresponds to a voltage on data line 104 below 1.0 v, comparator 101 produces a negative output causing counter 102 to countdown.

The countdown activity of counter 102 turns drivers "off" (e.g., drivers Qn and Qn-1) that were originally "on" until the drop in total current pulled through load resistor 103 corresponds to a resulting increase in data line 104 voltage to the proper voltage of 1.0 v. When the proper voltage is reached, the comparator 101 output becomes neutral (signifying the feedback loop is in a steady state and) causing the countdown activity to stop. A device's feedback circuit typically operates during a set aside calibration period rather when its data is actually being read.

Similarly, if the total current pulled by all "on" drivers corresponds to a voltage on data line 104 above 1.0 v, the comparator 101 output becomes positive causing counter 102 to count up. The countup activity of counter 102 turns "off" drivers "on" until the increase in total current pulled through load resistor 103 corresponds to a resulting decrease in data line 104 voltage to the proper voltage. When the proper voltage is reached, the comparator 101 output becomes neutral (signifying the feedback loop is in a steady state and)causing the countup activity to stop.

A problem associated with memory subsystems designed according to the above described approach occurs during a "back-to-back" read. An example of a back to back read is shown in FIG. 1b. In a back to back read, two memory devices are read—one after the other. Thus, in FIG. 1b, device D24 is read just before device D4 is read. In order to hasten the timing between back to back reads, memory devices may be read on the rising 106 and falling 107 edges of the same clock as also seen in FIG. 1b.

During back to back reads of a logic high signal, where the second read corresponds to the memory device D4 that is closer to the reading device 105, signal integrity along data line 104 may be flawed as seen in FIG. 1c. FIG. 1c is a "zoom in" of the transition 114 between the D24 read interval 116 and the D4 read interval 117.

An ideal back-to-back read of logic high data appears as two 1.0 v pulses separated by a drop to a reduced voltage 115. At approximately the moment in time 119 that the closest device D4 turns its drivers "on", the farther device D24 also turns its drivers "off". However, because the effect of the farther device D24 having its drivers turned "off" is not seen until a propagation time 108 later (that is proportional to the length of the data line 104 trace between memory device D4 and D24), the voltage on data line 104 behaves as if both devices D4 and D24 are actively pulling current.

Thus, the reduced voltage 115 corresponds to the voltage resulting from both memory devices (e.g., both D4 and D24) effectively having "on" drivers. The reduced voltage 115 should last until a propagation time 108 later when the effect of D24's turning of its drivers "off" is observed and the voltage on data line properly rises back to 1.0 v.

In many cases, however, the ideal signal just described does not result. Instead of dropping to reduced voltage 115 when device D4 turns its drivers on the data line 104 voltage gradually decays as observed in trace 120. When the effect of the deactivation of D24's drivers is observed (propagation time 108 later), the data line 104 voltage jumps to an elevated level 118 as observed in trace 109. In some instances the difference 110 between elevated voltage 118 and 1.0 v is sufficient to cause D4 read being improperly read as a logic "low" (e.g., 1.4 v or higher) rather than a logic "high".

Thus a flawed signal 120, 109 (shown in FIG. 1c) may be observed along a data line 104 undergoing a back to back read. The cause of the flawed signal 120, 109 is related to the Ids v. Vds characteristics of the transistors within the drivers Q1 through Qn that are turned on at time 119. Specifically, the transistors exhibit a reduced output impedance as the voltage on data line 104 drops.

Output impedance is the inverse of the slope of the Ids v. Vds curve. More generically, high output impedance is characterized by a substantially level portion of the transistor curve while low output impedance is characterized by a substantially sloped portion of the transistor curve. For field effect transistors, Ids is a transistor's drain to source current while Vds is a transistor's drain to source voltage. Thus, referring to the typical Ids v. Vds curve 113 shown in FIG. 1d, high output impedance is observed in curve region 111 (having near zero slope) while low output impedance is observed in curve region 112 (having significant slope). Note the transition between the low 112 and high 111 output impedance regions occurs at a Vds voltage of Vx. Vx is the Vds voltage where velocity saturation is approximately reached.

If Vx is approximately 1.0 v, the output impedance of the driver transistors will drop as the voltage on data line 104 falls below 1.0 v. That is, as the voltage on data line 104 continually falls below 1.0 v, the driver transistors continually pull less and less current. As such, at moment 119 when D4's driver's are turned on, the transistors within these drivers will pull less and less current as the voltage on data line 104 falls. Hence signal 120 correlates to the falling of curve 113 within region 112.

Thus, for driver transistors having a Vx near 1.0 v, the signal integrity problem discussed with respect to FIG. 1c is related to the decay of the driver transistors' output impedance.

SUMMARY OF INVENTION

A method is described that compares two voltages, one of the voltages indicative of a data line voltage, a second of the voltages indicative of a reference voltage. An input signal is sent to each of a plurality of drivers where at least one of the drivers is coupled to the data line. The input signal is based upon the comparison. A bias is applied to a transistor from the input signal, the bias keeping the transistor in a high output impedance state when the two voltages are the same.

Other features and advantages of the present invention will be apparent from the accompanying drawings and from the detailed description that follows below.

BRIEF DESCRIPTION OF THE DRAWINGS

The present invention is illustrated by way of example, and not limitation, in the figures of the accompanying drawings in which like references indicate similar elements and in which:

FIG. 5b shows another embodiment of the approach shown in FIG. 5a.

DETAILED DESCRIPTION

A method is described that compares two voltages, one of the voltages indicative of a data line voltage, a second of the voltages indicative of a reference voltage. An input signal is sent to each of a plurality of drivers where at least one of the drivers is coupled to the data line. The input signal is based upon the comparison. A bias is applied to a transistor from the input signal, the bias keeping the transistor in a high output impedance state when the two voltages are the same.

Figure 2A:
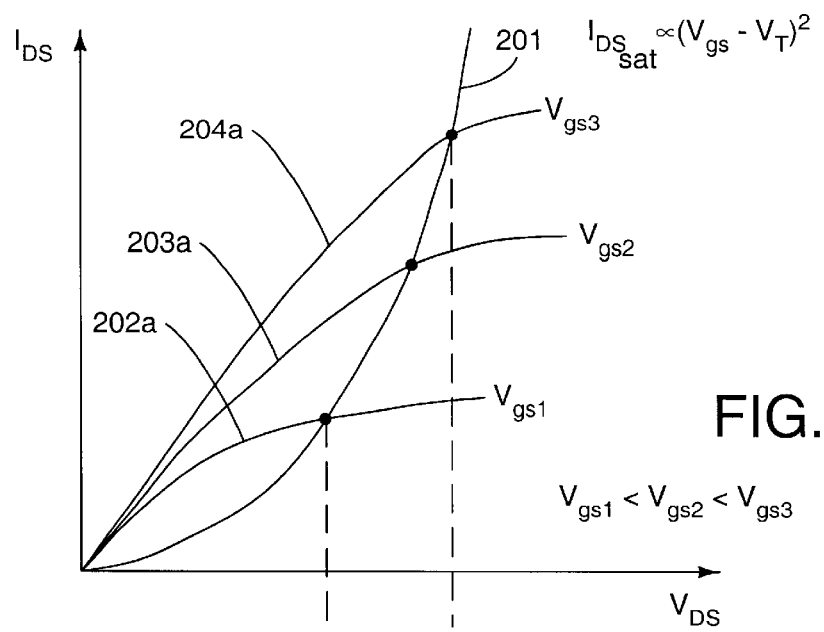
FIG. 2a is a detailed depiction of the Ids v Vds curves associated with a driver transistor.

A solution to the signal integrity problem discussed in the background involves implementing the drivers with transistors having enhanced output impedance. That is, a solution involves employing transistors having a reduced Vx value. FIG. 2a shows a more detailed depiction of the Ids v. Vds characteristics associated with a typical driver transistor.

As is known in the art, Ids increases as Vgs increases (where Vgs is the transistor's gate to source voltage). Thus, as seen in FIG. 2a, transistor curves 202a, 203a, 204a show increasing Ids with respect to one another since the Vgs associated with each curve is also increasing. That is, Vgs1<Vgs2<Vgs3.

Figure 2B:
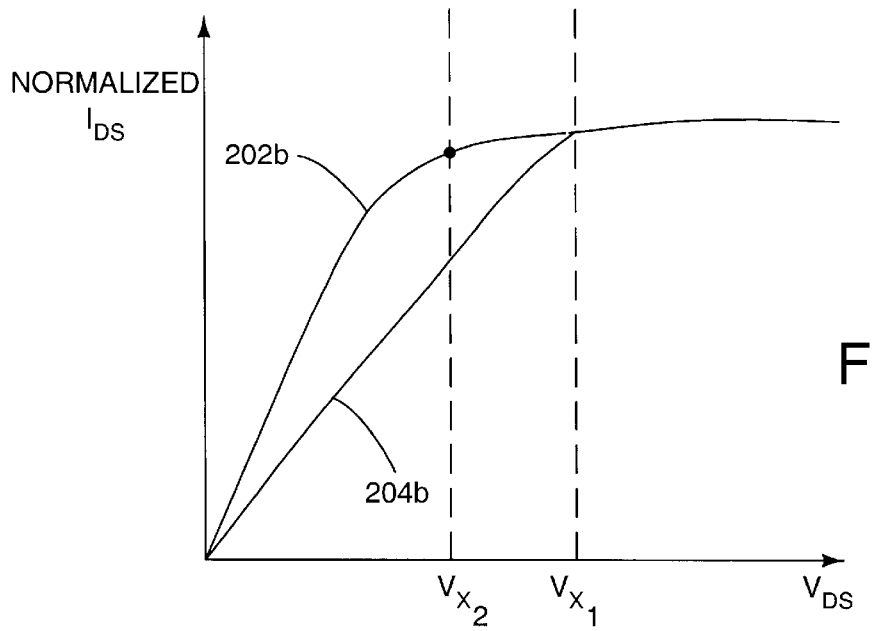
FIG. 2b shows the difference in output impedance, as a function of applied gate voltage, associated with a driver transistor.
Figure 2C:
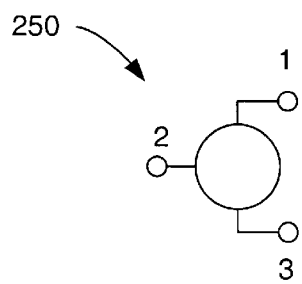
FIG. 2c shows a generic model of a transistor.

Note that a different Vx applies for each curve 202a, 203a, 204a. As is known in the art and as seen in FIG. 2a, Vx approximately varies as $(Vgs-Vt)^2$. Since the variation is to the second power, noticeably improved transistor characteristics may be realized at low Vgs values. That is, a transistor will exhibit higher output impedance at low Vds values (i.e., low Vx) for lower applied voltages. FIG. 2b shows this effect in greater detail. FIG. 2b is a depiction of curves 202a, 204a (of FIG. 2a) normalized by their respective saturation Ids value. Note the curve 202b (which corresponds to curve 202a) does not begin to drop its output impedance until a Vds voltage of Vx2 is reached. However, curve 204b (which corresponds to curve 204a) begins to drop its output impedance at the higher Vds voltage of Vx1.

Thus, an approach to the signal integrity problem discussed in the background is to configure the transistors that drive a data line such that they remain in a high output impedance state as the data line voltage drops. In light of the discussion above with respect to FIG. 2b, transistors having a minimal or lower Vgs will be able to maintain a high output impedance state at lower data line voltages as compared to transistors having a large applied Vgs value.

Figure 1A:
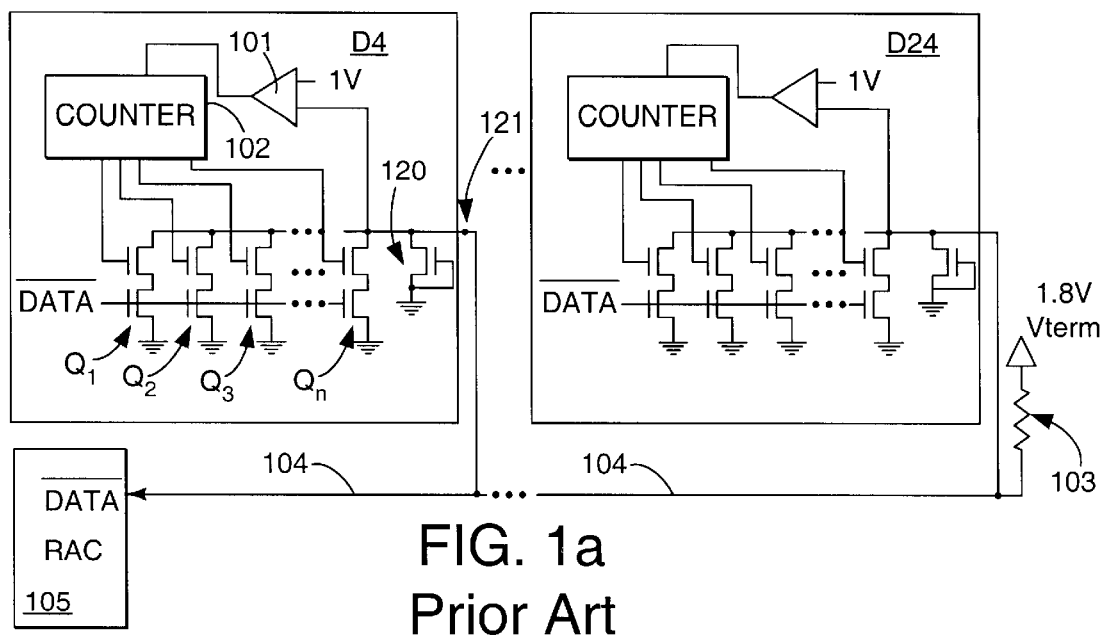
FIG. 1a is a depiction of a memory subsystem (prior art).
Figure 1B:
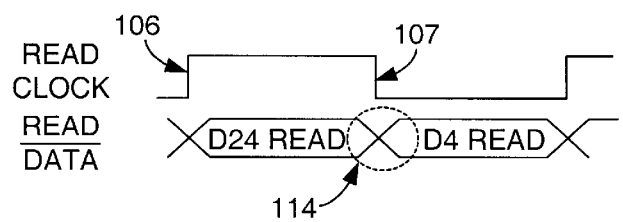
FIG. 1b is a depiction of a back to back read within the memory subsystem of FIG. 1a (prior art).
Figure 1C:
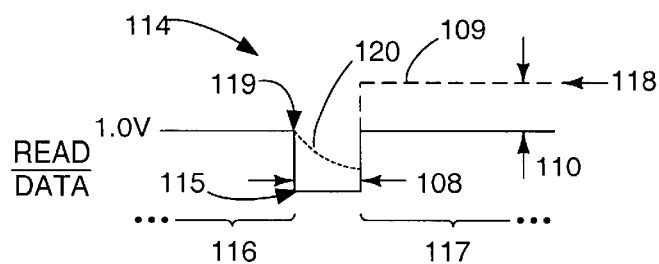
FIG. 1c is a depiction of a signal integrity problem associated with the back to back read of FIG. 1b (prior art).
Figure 1D:
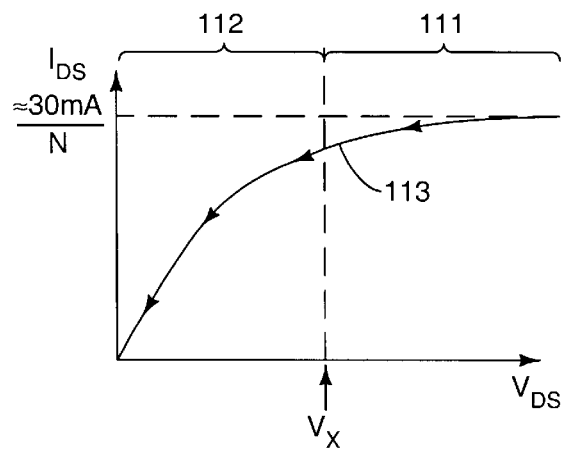
FIGS. 1d is a depiction of an Ids v. Vds curve associated with a driver transistor within the memory devices of FIG. 1a (prior art).

Referring to FIG. 1a, a typical counter 102 will provide an output voltage (to the proper number of activated drivers) that is comparable to the supply voltage used to power the counter's 102 output logic. Thus, activated driver transistor inputs coupled to the counter 102 output will receive a large Vgs that is similarly comparable to the supply voltage. Since this may be unacceptable for a high output impedance solution, the prior art feedback loop should be modified in order to apply a reduced gate voltage to the driver transistors.

In an embodiment, the prior art design of FIG. 1a is modified such that the counter 102 outputs are level shifted. Level shifting each counter 102 output will drop the Vgs applied to each driver transistor that is coupled to the counter 102. Level shifting each data bar input will drop the Vgs applied to each driver transistor that is coupled to data bar. Level shifting may be accomplished by various techniques such as inserting, between the driver transistor and counter 102 output, a resistor that is shunted by a device (between the transistor gate and ground) that has a voltage drop (e.g., a diode or another resistor). In other embodiments, the counter 102 may be designed to produce output voltages that are substantially lower than the counter's supply voltage.

Figure 2D:
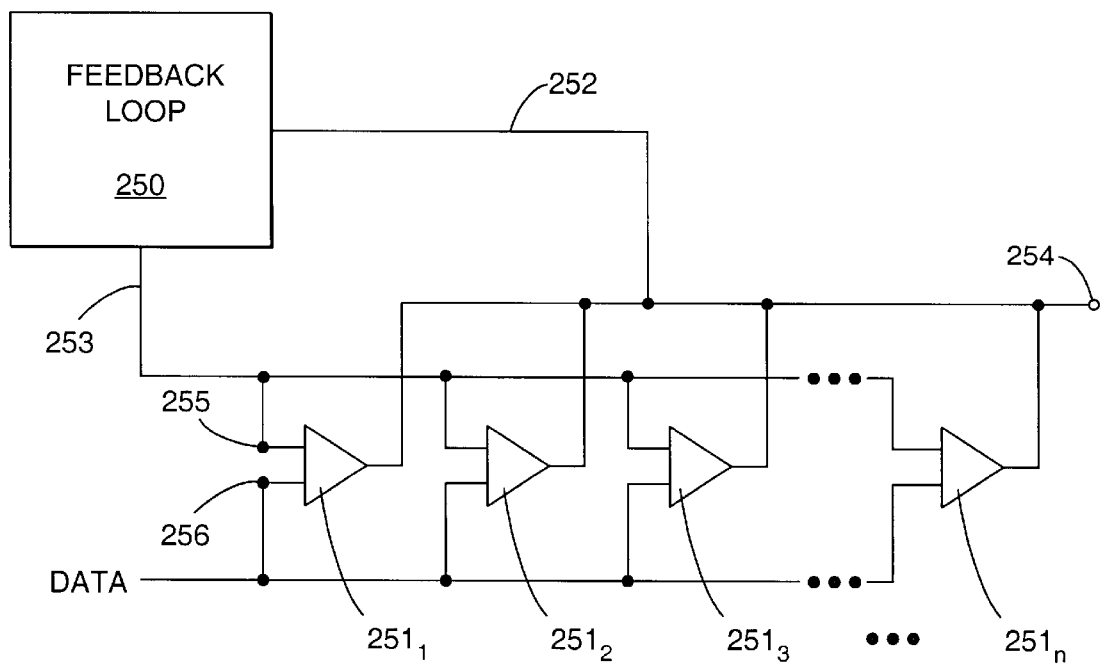
FIG. 2d shows an approach for maintaining driver transistors in a high output impedance state.

Other embodiments correspond to the approach shown in FIG. 2d, which employs drivers $251_1$ through $251_n$ each of which have two inputs (e.g., inputs 255,256). A first input 255 is coupled to the output of a feedback loop 250. A second input 256 is coupled to a data signal the logical value of which (or its inverse) is to be driven onto a data line 254. The first input 255 is used to control the input applied to a driving transistor (e.g., a Vgs value on a CMOS transistor or a base current on a bipolar transistor) that drives the data line 254. The feedback loop 250 is configured to sample the data line 254 at an input 252 and produce at its output 253 a signal indicative of the voltage level (or need for more or less voltage) on data line 254. Because each driver circuit $251_1$ through $251_n$, is activated by feedback output 253 (unlike the prior art which activates only a portion of the drivers) the proper voltage level is reached on the data line 254 with a lower input applied to the driving transistors. This lower input allows each of the driver transistors to be kept in a high output impedance region as the voltage on data line 254 falls. More details in regard to this aspect are discussed further ahead.

Note that the capacitance on date line 254 (associated with the approach of FIG. 2) should not increase as compared to the capacitance of the date line 104 associated with the prior approach of FIG. 1a. Capacitance is largely a function of the number of drivers (and the size of the drivers) coupled to these data lines 104, 254. Because the approach of FIG. 2 may be implemented with approximately the same number and size of devices (if the designer so chooses) as may be used with a prior art approach, capacitance on line 254 should not significantly increase by incorporating the approach of FIG. 2. As a result, there should be no significant loss of speed in voltage rise/fall times if the approach of FIG. 2 is implemented.

Note that the approach just described above can be implemented in various driver $251_1$ through $251_n$ embodiments. For example, the drivers may be implemented with field effect transistors or bipolar driver transistors. As is known in the art, referring back to FIG. 2c, a transistor 250 may be viewed as a three node device. The second node 2 corresponds to the transistor input such as the gate of a field effect transistor or the base of a bipolar transistor. The second node has an associated bias such as a gate voltage for the field effect transistor or the base current for a bipolar transistor.

The first 1 and third 3 nodes correspond to the drain and source for field effect transistors or the collector and emitter for bipolar transistors, respectively. Since both types of transistors have low output impedance and high output impedance regions (determined by the particular bias established at the second node 2 in conjunction with the magnitude of the particular bias established across the first 1 and third 3 nodes), the approach of applying a bias at the second node 2 sufficient to keep a transistor in a high output impedance region during the presence of a particular data line voltage (which effects the bias established across the first 1 and third 3 nodes) may be employed with either field effect or bipolar transistors. Note also that bipolar transistors are frequently employed in drivers implemented with bipolar as well as BiCMOS process technology.

Drivers $251_1$ through $251_n$ are circuits used to drive data values onto a data line 254. Different driver circuits are possible. For example, many driver circuits have active pull up and/or active pull down. Active pull up typically couples a p type transistor (e.g., PMOS field effect transistor or PNP bipolar transistor) to a first reference voltage (e.g., a supply voltage) to pull up the data line potential to the first reference voltage. Active pull down typically couples an n type transistor (e.g., an NMOS field effect transistor or an NPN bipolar transistor) to a second reference voltage (e.g., a ground reference) to pull down the data line potential to the second reference voltage.

Driver circuits may also have passive pull up or passive pull down. In passive pull up, a load such as a resistor or diode circuit is used to pull up the data line potential; while for passive pull down, a similar load may be used to pull down the data line potential. Various driver circuits may be designed having one or more suitable combinations of the above described pull up or pull down schemes. For example, drivers Q1 through Qn of FIG. 1a employ active pull down with passive pull up (where resistor 103 acts as the passive pull up). Other driver circuits can have both active pull up and active pull down (such as an inverting driver having a PMOS transistor coupled "above" an NMOS transistor in a totem pole arrangement where the data line is coupled between the two devices). Still other driver circuits can have active pull up with passive pull down.

Because these and other driver circuits are possible, the scope of the present discussion should not be limited to the particular drivers discussed in detail herein. Nevertheless, note that signal integrity problems caused by the biasing of a driver transistor within a low output impedance region may be observed within any driver embodiment. For example, an active pull up driver may be improved by lowering the gate to source voltage or lowering the base current of its associated PMOS or PNP transistor.

Figure 3:
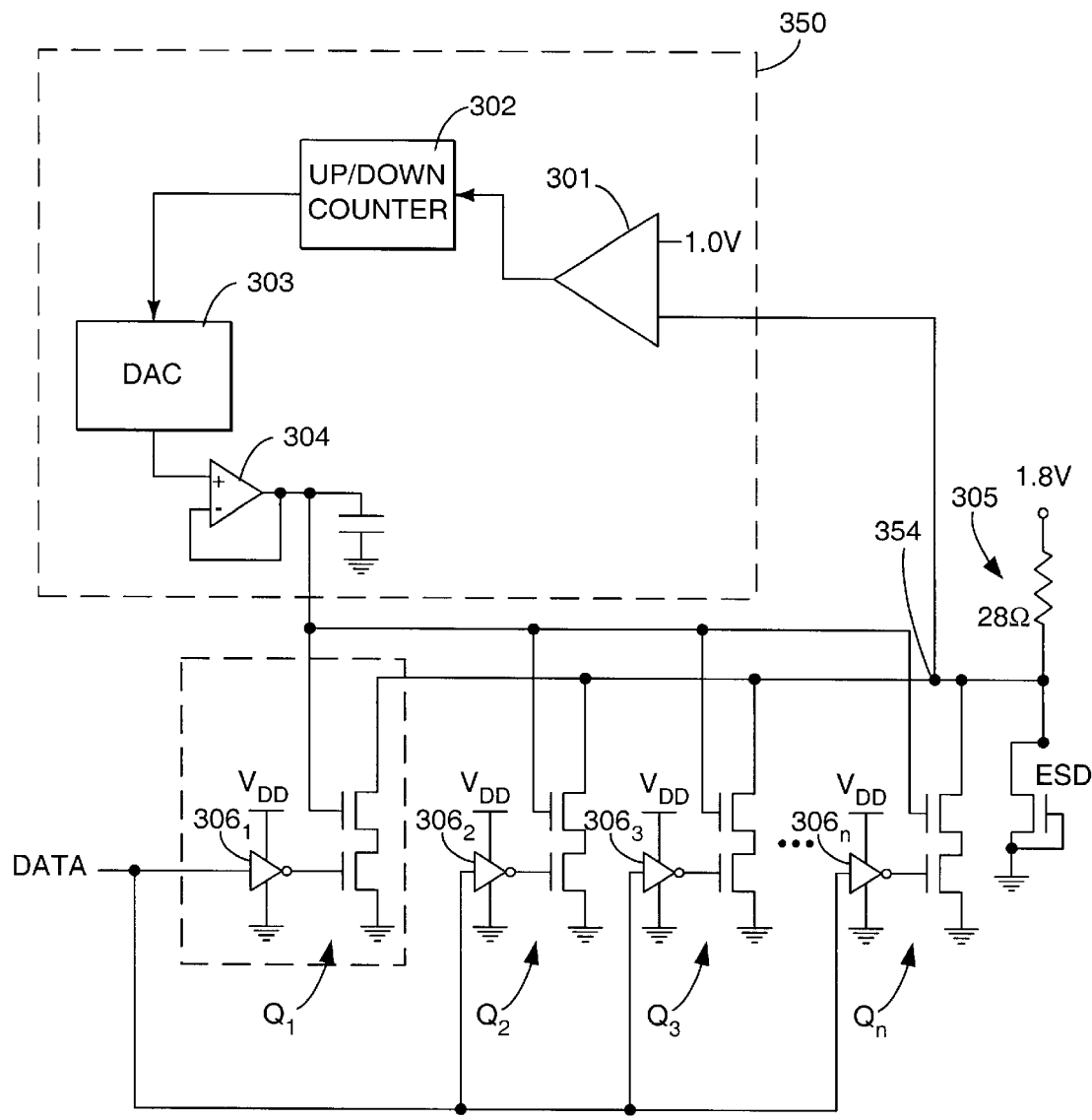
FIG. 3 shows an embodiment of a design that avoids the signal integrity problem of FIG. 1c.

A more detailed embodiment that conforms to the approach of FIG. 2d is shown in FIG. 3. In FIG. 3, circuit 350 corresponds to the feedback loop 250 of FIG. 2d and driver circuit $Q_1$ corresponds to driver circuit $251_1$. The voltage on the data line 354 is sampled by comparator 301 (typically during a calibration period rather than when data is actually being read) when the output is calibrated for a logic high value (e.g., 1.0 v).

As an example, for a reference voltage set at 1.0 v, if the data line voltage is above 1.0 v, the up/down counter 302 counts down. If the data line voltage is below 1.0 v, the up/down counter 302 counts up. Eventually, when the data line voltage reaches 1.0 v, the up/down counter 302 stops counting. If the counter 302 counts up, the digital-to-analog converter 303 increases the voltage delivered to voltage follower 304. If the counter 302 counts down, the digital-to-analog converter 303 lowers the voltage delivered to voltage follower 304. When the counter 302 stops counting (i.e., when the data line voltage reaches 1.0 v), the digital-to-analog converter 303 holds its output voltage.

Voltage follower 304 may have a unity gain (or non-unity gain) depending upon the range of output voltages supported by the digital-to-analog converter 304. Voltage follower 304 may be used to supply current sufficient to enable the inverters 306a–n that produce the data bar input to the driver transistors as seen in FIG. 3. Alternatively, drivers $306_1$ through $306_n$ may be supplied by another power source rather than follower 304. Again note that, unlike the prior art solution, the feedback loop output (i.e., voltage follower 304 output) feeds all drivers Q1 through Qn simultaneously rather than selectively turn some drivers "on" and other drivers "off" based upon the countup or countdown activity of the counter 302.

That is, once the voltage follower 304 output reaches the threshold voltage of the driver transistors, all drivers Q1 through Qn will be "on". As the voltage follower 304 output increases beyond the threshold voltage, all drivers Q1 through Qn sink approximately equal currents in parallel (in embodiments where the drivers are designed with transistors having approximately the same size and fabrication process parameters). Alternate embodiments, however, may vary the gain of one or more drivers such that some drivers drive more (or less) current than other drivers coupled to the data line for a give feedback loop output.

The effect of turning all drivers Q1 through Qn "on" has the effect of pulling the proper current through load resistor 305 with a minimal amount of gate voltage. That is, since all drivers Q1 through Qn are pulling current, a minimal amount of current needs to be pulled per driver. This corresponds to a low Vgs voltage, since lower driver currents result from lower applied Vgs voltages.

Note the actual Vgs voltage for a particular implementation will correspond to the number of drivers (i.e., "n") employed in the design. Lower Vgs voltages will be observed as the number of drivers increases. Note that the maximum voltage output of inverters 306a–n is equal to the output of voltage follower 304 (since the inverters 306a–n are powered by follower 304). Note also that the approach of FIG. 3 may be implemented with a single driver (i.e., n=1). Thus n may be any integer greater than 0.

Designs having n=1 may be preferable in some applications because a single driver embodiment may result in a larger driver transistor width. Large transistor width corresponds to a high gain transistor (because width is measured perpendicular to current flow). High gain corresponds to a lower Vgs for a particular output current. High gain transistors maintain a higher output impedance state for a lower Vgs (as compared to lower gain transistors) as a result. Furthermore, implementing a single driver (with a high gain driver transistor) within approximately the same amount of semiconductor surface area that would be used for a multiple driver embodiment will keep the capacitance of these embodiments comparable. As a result, even though a large transistor is used, no appreciable increase in capacitance will be realized.

Figure 4:
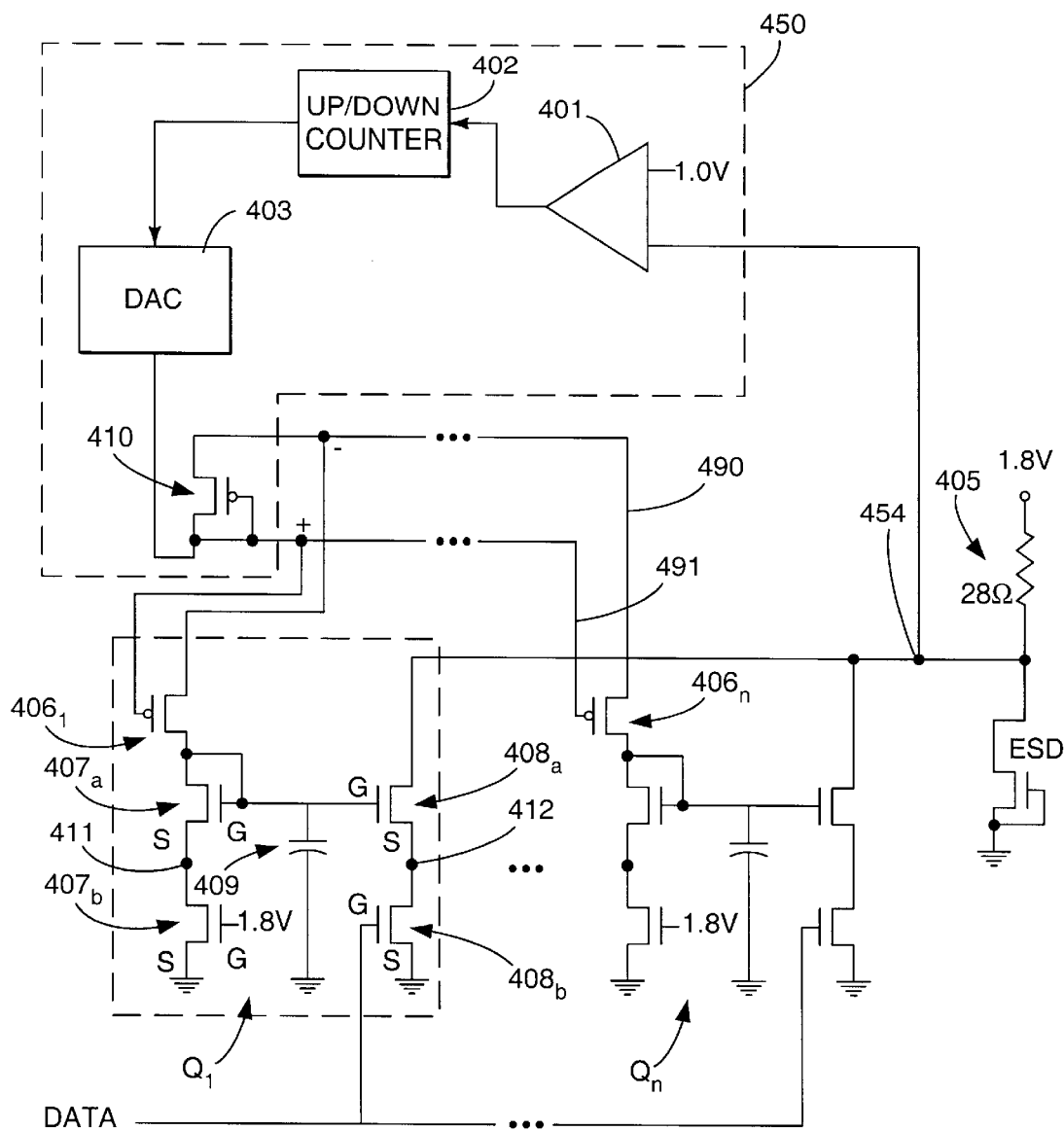
FIG. 4 shows another embodiment of a design that avoids the signal integrity problem of FIG. 1c.

Another embodiment that conforms to the approach of FIG. 2d is shown in FIG. 4. Circuit 450 corresponds to the feedback loop 250 and driver $Q_1$ corresponds to driver $251_1$. Note that the feedback loop 450 has two nets 490, 491 at its output. The feedback of loop of FIG. 4 operates similar to the feedback loop of FIG. 3, however, the digital-to-analog converter 403 of figure is configured to convert the countup or countdown signal to an analog current (unlike the digital-to-analog converter 303 of FIG. 3 which converts the countup or countdown signal to an analog voltage).

In an embodiment, the output current from digital-to-analog converter 403 is distributed equally to drivers Q1 through Qn because each of the drivers Q1 through Qn are designed with approximately identical transistors (i.e., same gate width, doping, etc.); although other embodiments may choose to have drivers designed with different gains (which may be implemented with different transistors per driver). For simplicity, FIG. 4 only shows two drivers, Q1 and Qn. Again, n may be any integer greater than 0. Similar to the approach of FIG. 3, the embodiment shown in FIG. 4 operates with all drivers "on" in order to minimize the gate voltage applied to the driver transistors responsible for pulling current through load resistor 405.

In the embodiment shown in FIG. 4, drivers Q1 through Qn are designed with current mirrors. In a current mirror design, the behavior of driver transistors 407a,b (in response to the current received from the digital-to-analog converter 403) is used to control the driver transistors 408a,b that pull current through load resistor 405. Note that if the magnitude of the current sent by digital-to-analog converter 403 is sufficient to achieve the proper data line 454 voltage, the current mirror design within each driver Q1 through Qn may have unity gain.

That is, the current pulled by transistor 408a may be identical to the current received by transistor 407a from the digital-to-analog converter 403. In other embodiments, these currents may be different in order to properly translate the current magnitude from the digital-to-analog-converter 403 to the current magnitude pulled through the resistor 405.

In the embodiment of FIG. 4, NMOS transistor 410 acts as an active load having a Vds drop of $Vt+(Ids/Gm)^{0.5}$ (where Gm is the transistor transconductance). The Vds voltage drop across NMOS transistor 410 is used to clamp the voltage across the source and gate of each driver's PMOS transistor (e.g., PMOS transistor $406_1$). The relative size of the NMOS transistor 410 to the PMOS transistors $406_{1-n}$ can be adjusted to design the current flow from the digital-to-analog converter 403 to each driver Q1 through Qn. For example, NMOS transistor 410 may be tailored to flow 10 mA of current for a Vgs of 0.68 v while the PMOS transistor (e.g., transistor $406_1$) within each of 10 drivers may be tailored to flow 1 mA of current at a Vgs of 0.68 v. In this example, the ten drivers are designed to evenly pull (at 1 mA per driver) current from the 10 mA NMOS transistor 410.

Once the current through each driver is determined, the Vgs applied to driver transistor 408a is controlled by the voltage drop across the active load formed by driver transistor 407a. In one approach, transistors 407b and 408b are scaled such that nodes 411, 412 always have the same voltage. For equal currents pulled through transistors 407a and 408a, the scaling will be 1:1.

Since nodes 411 and 412 have equal voltages, the Vgs of transistors 407a, 408a will also be equal. Thus, a desirably low Vgs value may be applied to transistor 408a by controlling the voltage drop across the active load embodied in transistor 407a. Those of ordinary skill can tailor the dimensions of these transistors to produce the proper Vgs for the range of currents to be pulled through them. In this manner, low applied Vgs may be used to realize high output impedance for low data line 454 voltages.

The current that runs through a totem pole structure (such as transistor 408a over transistor 408b) is defined by the device having the lowest Vgs (for equally sized transistors). Thus, the data signal does not need to be level shifted in the embodiment of FIG. 4 because of the current mirror approach. Since transistor 407b has a gate voltage set at the supply voltage, its mirror transistor 408b can receive a full supply voltage at the gate voltage from the data signal.

Figure 5A:
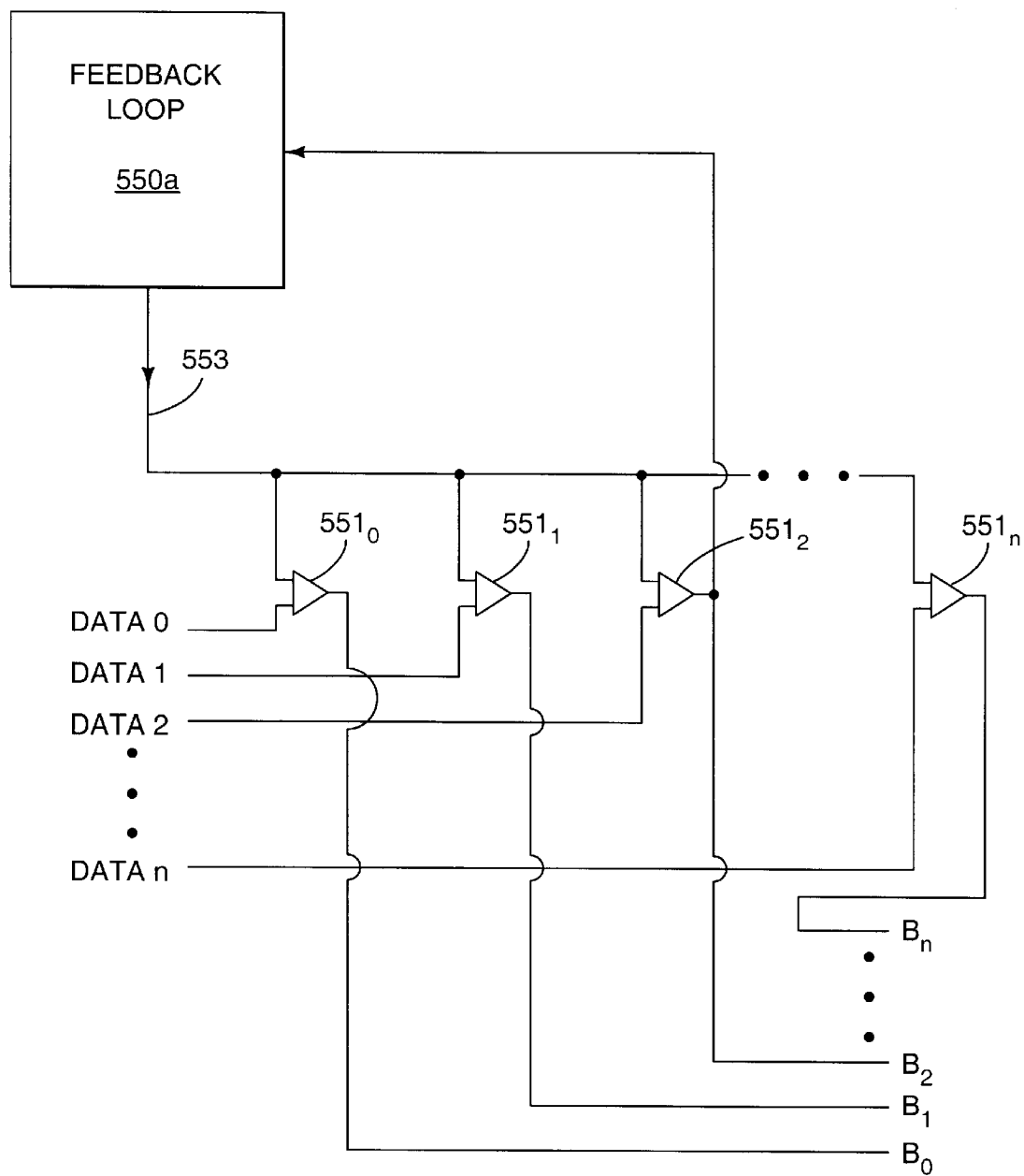
FIG. 5a shows an approach for driving a plurality of data lines with driver transistors in a high output impedance state.

FIG. 5a shows an approach for driving a plurality of data lines having driver transistor(s) in a high output impedance state. In FIG. 5a, feedback loop output 553 drives each of a plurality of drivers $551_1$ through $551_n$, similar to the approach shown back in FIG. 2d. Each driver $551_1$ through $551_n$, however, drives its own associated data line. For example, as seen in FIG. 5a, driver $551_n$ drives data line $B_n$, driver $551_3$ drives data line $B_2$, etc. In an embodiment, data lines $B_0$ through $B_n$ correspond to data lines used on a bus such as a memory data bus or a memory address bus.

In the approach of FIG. 5a as well as other similar approaches, the feedback loop output 553 (which controls the output level of each driver $551_1$ through $551_n$) is determined from the sampling of at least one date line. As seen in FIG. 5a, data line $B_2$ is sampled as the feedback loop 550a input. Here, the output voltage on data lines $B_0$ through $B_n$ are based upon the sampling of data line $B_2$. Thus the voltage level on one data line (e.g., $B_2$) is used to set the voltage level on another data line (e.g., $B_0$). The example of FIG. 5a shows an embodiment where a single data line ($B_2$) output is used to control the outputs on the other data lines ($B_0$, $B_1$, $B_n$, etc.).

Figure 5B:
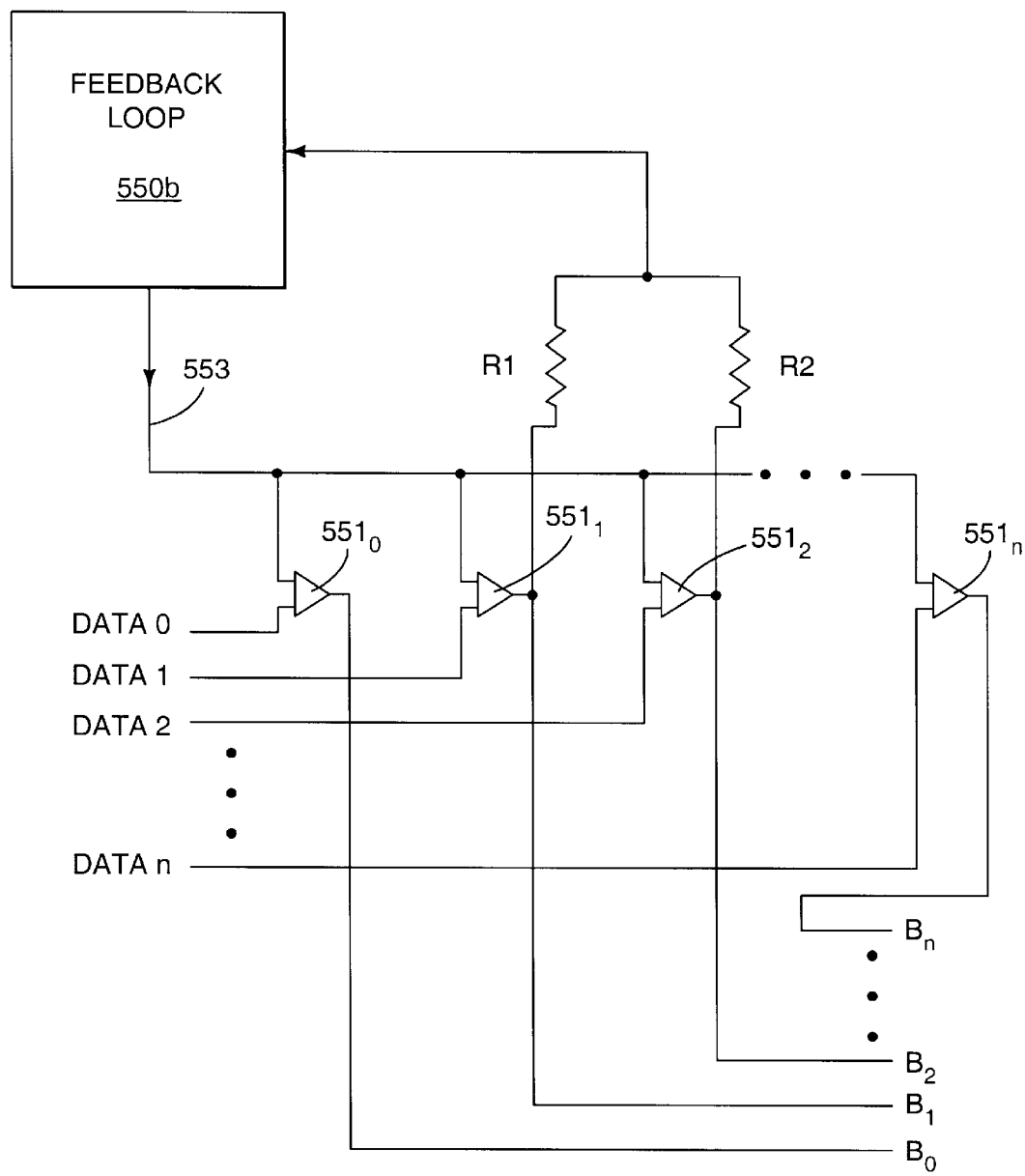

In other cases a plurality of data line outputs may be sampled to determine the feedback loop output 553. FIG. 5b shows an example. In FIG. 5b, data lines $B_1$ and $B_2$ are sampled. The plurality of sampled data line outputs may be averaged or otherwise combined to produce a single input to the feedback loop 550b that is reflective of the output levels, as a whole, appearing on the sampled data lines. For example, as seen in FIG. 5b, resistors $R_1$ and $R_2$ are coupled together at the feedback loopback 550b input as well as to each respective sampled data line $B_1$, $B_2$. The coupling of resistors R1 and R2 at the feedback loop 550b input produces a single input that reflects the output levels, as a whole, appearing on both data line $B_1$ and data line $B_2$.

In an embodiment, the sampling occurs during a calibration time period in which valid data does not appear on the sampled data lines. During this calibration time period, a test vector is used to establish the data values Data 1 and Data 2 that affect the logic level of the data line outputs $B_1$ and $B_2$ respectively. In one embodiment the data values Data 1, Data 2 are set at 0, 1 such that the feedback loop 550b input receives a voltage indicative of the midpoint between a high voltage level and a low voltage level on data lines $B_1$ and $B_2$. In another embodiment Data 1 Data 2 are set at 1, 1 to provide a feedback loop input indicative of the high voltage level average of data lines $B_1$ and $B_2$.

It is important to point out that although much of the above discussion has focused upon implementations having logic voltage levels of 1.8 v and 1.0 v, those of ordinary skill will be able to implement solutions for applications having different voltage levels. Note also that embodiments of this invention may be implemented not only within a semiconductor chip but also within machine readable media. For example, these designs may be stored upon and/or embedded within machine readable media associated with a software design tool used for designing semiconductor devices. Examples include VHSIC Hardware Description Language (VHDL) netlists, Verilog Register Transfer Level (RTL) netlists, and transistor level (e.g., SPICE or SPICE related files) netlists. Note that such netlists may be synthesized as well as synthesizable. Machine readable media also includes media having layout information such as a GDS-II file. Furthermore, netlist files or other machine readable media for semiconductor chip design may be used in a simulation environment to perform the methods of the designs described above.

Thus, it is also to be understood that embodiments of this invention may be used as or to support software programs executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. An apparatus, comprising:
a transistor coupled to a data line, said transistor having three nodes, said transistor having high and low output impedance regions, said regions defined by a first bias applied at a second of said three nodes and a second bias applied across a first and third of said three nodes, said second bias determined by said data line voltage, said first bias configured to keep said transistor in a said high output impedance region when said data line voltage corresponds to said second bias having a magnitude at or below 1.0 volt.

2. The apparatus of claim 1 wherein said transistor is a field effect transistor and said first bias is a gate voltage.

3. The apparatus of claim 2 wherein said field effect transistor is an NMOS transistor and said second bias is a drain to source voltage.

4. The apparatus of claim 3 wherein said drain is connected to said data line.

5. The apparatus of claim 1 wherein said field effect transistor is a PMOS transistor and said second bias is a source to drain voltage.

6. The apparatus of claim 5 wherein said drain is connected to said data line.

7. The apparatus of claim 1 wherein said transistor is a bipolar transistor and said first bias is a base current.

8. The apparatus of claim 7 wherein said transistor is an NPN transistor and said second bias is a collector to emitter voltage.

9. The apparatus of claim 8 wherein said collector is connected to said data line.

10. The apparatus of claim 9 wherein said transistor is implemented in a BiCMOS technology.

11. The apparatus of claim 7 wherein said transistor is a PNP transistor and said second bias is a emitter to collector voltage.

12. The apparatus of claim 11 wherein said collector is connected to said data line.

13. The apparatus of claim 12 wherein said transistor is implemented in a BiCMOS process technology.

* * * * *

UNITED STATES PATENT AND TRADEMARK OFFICE
CERTIFICATE OF CORRECTION

PATENT NO. : 6,330,193 B1  Page 1 of 1
DATED : December 11, 2001
INVENTOR(S) : Yu et al.

It is certified that error appears in the above-identified patent and that said Letters Patent is hereby corrected as shown below:

Column 6,
Line 65, replace "in" with -- for --.

Column 10,
Line 13, insert -- a -- after "than".

Signed and Sealed this

Twenty-fifth Day of February, 2003

JAMES E. ROGAN
*Director of the United States Patent and Trademark Office*